(12) United States Patent
Hall

(10) Patent No.: US 6,930,517 B2
(45) Date of Patent: Aug. 16, 2005

(54) DIFFERENTIAL TRANSISTOR AND METHOD THEREFOR

(75) Inventor: Jefferson W. Hall, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 21 days.

(21) Appl. No.: 10/670,978

(22) Filed: Sep. 26, 2003

(65) Prior Publication Data

US 2005/0068068 A1 Mar. 31, 2005

(51) Int. Cl.[7] .................................................. H03B 1/00
(52) U.S. Cl. ........................ 327/108; 327/112; 327/391
(58) Field of Search .................................. 327/108, 112, 327/118, 391, 403, 404, 427, 581, 407, 435, 408, 437; 326/113, 117, 129, 121

(56) References Cited

U.S. PATENT DOCUMENTS

| | | | | |
|---|---|---|---|---|
| 4,203,157 A | | 5/1980 | Daniels et al. ............... | 708/714 |
| 5,359,243 A | * | 10/1994 | Norman ....................... | 326/121 |
| 5,541,549 A | * | 7/1996 | Kubota ........................ | 327/391 |
| 6,380,769 B1 | * | 4/2002 | Hall et al. ................... | 327/112 |
| 6,507,058 B1 | | 1/2003 | Hall et al. ................... | 257/285 |

* cited by examiner

Primary Examiner—Long Nguyen
(74) Attorney, Agent, or Firm—Robert F. Hightower

(57) ABSTRACT

A differential transistor (10, 25) includes a depletion mode transistor (15,30) that has a source connected to a source of an enhancement mode transistor (11,26). The gates of the depletion mode and enhancement mode transistors are driven differentially.

10 Claims, 6 Drawing Sheets

DIFFERENTIAL TRANSISTOR AND METHOD THEREFOR

BACKGROUND OF THE INVENTION

The present invention relates, in general, to electronics, and more particularly, to methods of forming semiconductor devices and structure.

In the past, the semiconductor industry utilized depletion mode transistors in various configurations and applications. One particular technique utilized two serially connected depletion mode transistors of opposite conductivity types to provide low voltage operation and low leakage current. Such a technique is disclosed in U.S. Pat. No. 6,380,769 issued to Hall et al on Apr. 30, 2002, which is hereby incorporated herein by reference. Forming both N-channel and P-channel depletion mode transistors required extra processing steps to form the N-channel depletion mode transistor and further additional processing steps to form the P-channel depletion mode transistor. Such extra processing steps increased the cost of the semiconductor device using the depletion mode transistors.

Accordingly, it is desirable to have a method of using depletion mode transistors that requires fewer processing operations.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

Figure 1:
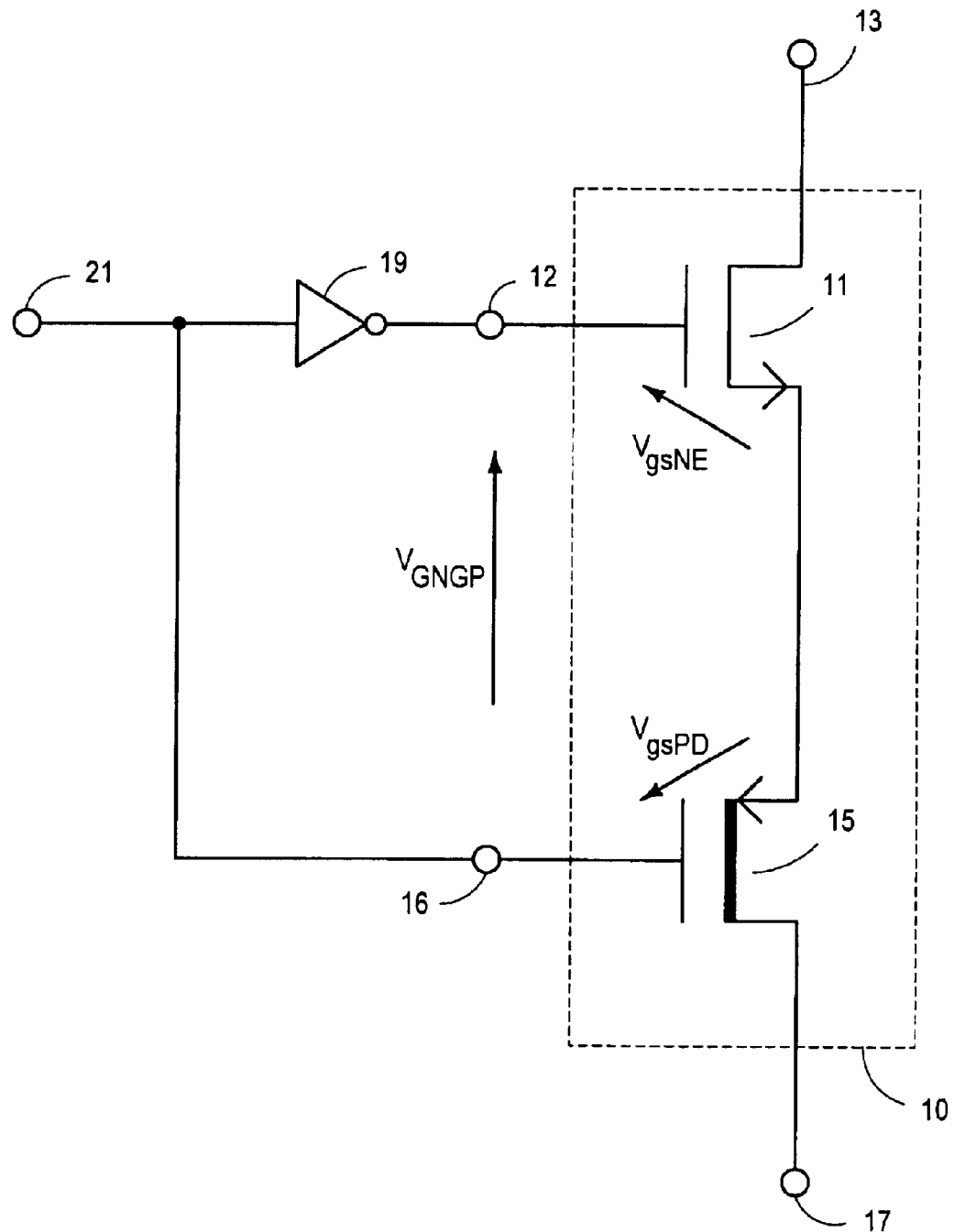
FIG. 1 schematically illustrates an embodiment of a portion of a differential transistor in accordance with the present invention.

FIG. 1 schematically illustrates a portion of an embodiment of a differential transistor switch element or differential transistor 10. Transistor 10 includes an N-channel enhancement mode transistor 11 and a P-channel depletion mode transistor 15 that has a source connected to a source of transistor 11. The drain of transistor 11 is connected to an input 13 of transistor 10 to receive a first signal and the drain of transistor 15 is connected to receive a second signal on an input 17 of transistor 10. Transistor 10 also includes a first control input 12 that is connected to a gate of transistor 11 and a second control input 16 that is connected to a gate of transistor 15. Since the sources of transistors 11 and 15 are connected together, a differential gate-to-gate voltage ($V_{GNGP}$) is applied across the gates of transistors 11 and 15, thus between inputs 12 and 16, to enable and disable transistors 11 and 15, thus, respectively enable and disable transistor 10. Transistors 11 and 15 are formed so that transistor 10 is enabled when the differential gate-to-gate voltage ($V_{GNGP}$) is no greater than a threshold voltage of transistor 10 ($V_{th10}$).

It can be seen from FIG. 1 that:

$$V_{GNGP} = V_{gsNE} - V_{gsPD} \quad \text{[Equation 1]}$$

Where:
$V_{gsNE}$ is the gate-to-source voltage of N-Channel enhancement mode transistor 11, and
$V_{gsPD}$ is the gate-to-source voltage of P-Channel depletion mode transistor 15.

For transistor 10 to be enabled, both transistors 11 and 15 have to be enabled. Transistor 11 is enabled when $V_{gsNE}$ is equal to or greater than the threshold voltage of transistor 11 ($V_{thNE}$), which is a positive number for this N-type enhancement mode transistor, and transistor 15 is enabled when $V_{gsPD}$ is less than the threshold voltage of transistor 11 ($V_{thPD}$), which is a positive number for this P-type depletion mode transistor. Substituting the threshold voltage and converting to an inequality determining the conducting state yields:

$$V_{GNGP} \geq V_{thNE} - V_{thPD} \quad \text{[Equation 2]}$$

Thus, transistor 10 is enabled or turned-on when $V_{GNGP}$ is greater than ($V_{thNE} - V_{thPD}$).

In the preferred embodiment, ($V_{thNE} - V_{thPD}$) is chosen to be less than or equal to zero volts (0 V) so that transistor 10 is enabled when $V_{GNGP}$ is greater than or equal to zero. This value facilitates using transistor 10 to provide a known state in power control applications such as when power is first applied and is near zero volts. Substituting this into the above equation yields:

$$0 \geq V_{thNE} - V_{thPD} \quad \text{[Equation 3]}$$

In the preferred embodiment transistors 11 and 15 are formed so that the difference in the threshold voltages ($V_{thNE} - V_{thPD}$) is close to zero so that transistor 10 can be turned-on with a minimum applied voltage. Thus, transistors 11 and 15 are formed so that the absolute value of the threshold voltage of transistor 15 is equal to or greater than the threshold voltage of transistor 11. This ensures that transistor 10 is enabled whenever $V_{GNGP}$ is greater than or equal to zero. Thus, transistor 10 is enabled or turned-on when no $V_{GNGP}$ voltage is applied and is turned-off or disabled by applying a $V_{GNGP}$ voltage that is less than ($V_{thNE} - V_{thPD}$). In order to provide tolerances for process and other manufacturing variations, the threshold voltage of transistor 15 is formed so that it is never less than that of transistor 11 as shown by Equation 3. The threshold voltage of transistors 11 and 15 can be formed or adjusted by a variety of methods and processes that are well known to those skilled in the art.

It can be seen from the prior explanation, that transistor 10 can also be formed to have a threshold voltage that is a value other than zero, and that transistors 11 and 15 can be formed to enable transistor 10 when $V_{GNGP}$ is greater than that threshold voltage, and to disable transistor 10 when $V_{GNGP}$ is less than that threshold voltage. It can also be seen that not just any combination of transistors will provide transistor 10 with the desired operation characteristics. It is important to form transistors 11 and 15 so the respective threshold voltages satisfy equations 2 and 3 in order for transistor 10 to have the desired threshold voltage and operation.

Using only one depletion mode transistor in transistor 10 reduces the number of process steps required to form transistor 10 thereby reducing the manufacturing cost of transistor 10 and circuits that use transistor 10. The depletion mode P-channel can be scaled in terms of channel length and width to account for the fact that it has lower mobility than the N-channel enhancement mode transistor.

An inverter 19 is shown in FIG. 1 to illustrate that inputs 12 and 16 are driven differentially in order to ensure that transistor 10 is enabled and disabled. Inverter 19 receives an input signal on an input 21. The input signal drives the gate of transistor 11 and inverter 19 drives the gate of transistor 15 with a signal that is out of phase with the input signal to ensure that transistors 11 and 15 are driven differentially to enable and disable transistor 10.

Figure 2:
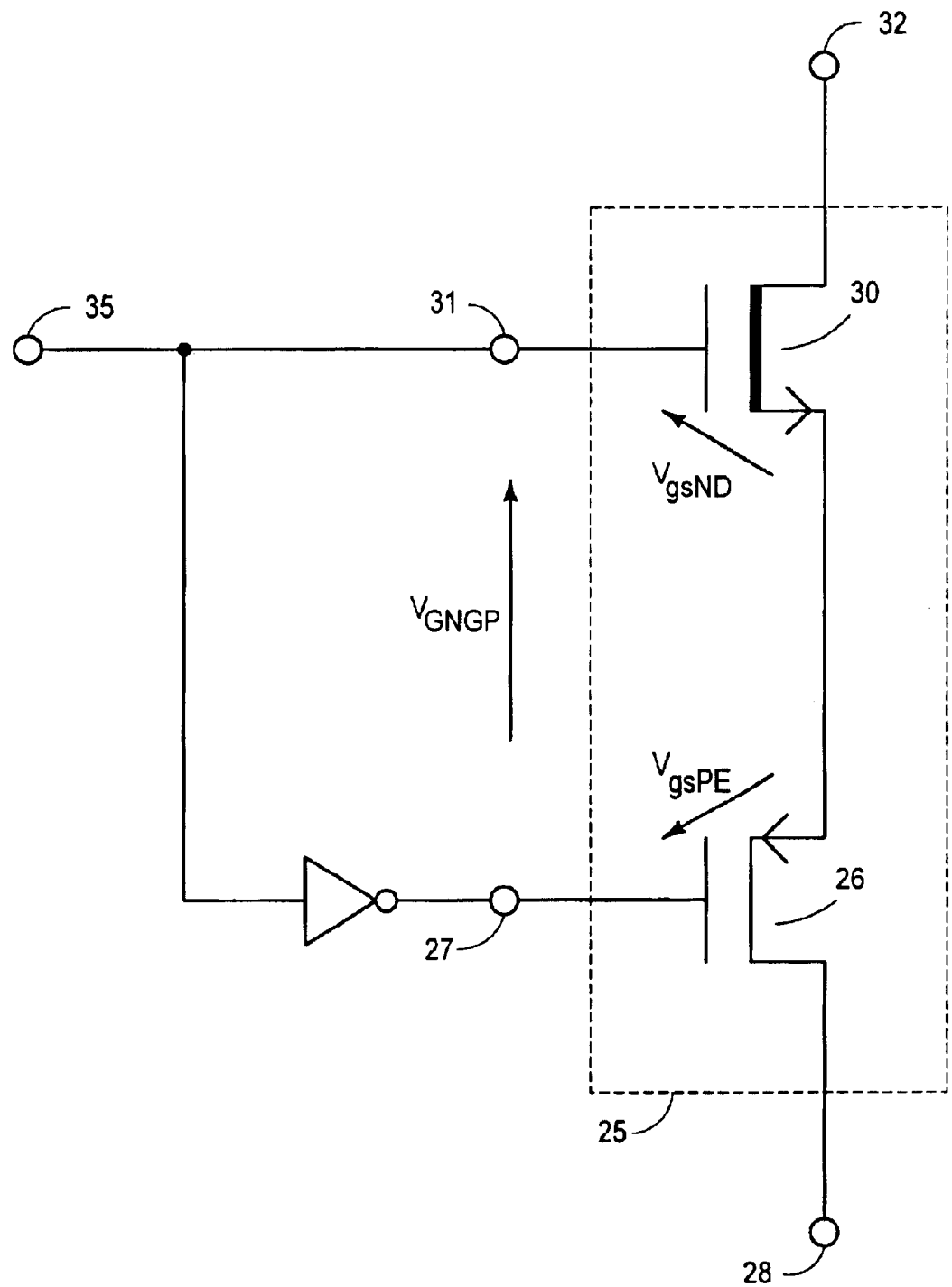
FIG. 2 schematically illustrates a portion of another embodiment of a differential transistor in accordance with the present invention.

FIG. 2 schematically illustrates a portion of an embodiment of a differential transistor switch element or differential transistor 25 that is an alternate embodiment of transistor 10 illustrated in FIG. 1. Transistor 25 includes a P-channel enhancement mode transistor 26 and an N-channel depletion mode transistor 30 that has a source connected to a source of transistor 26. The drain of transistor 26 is connected to an input 28 of transistor 25 to receive a first signal and the drain of transistor 30 is connected to receive a second signal on an input 32 of transistor 25. Inputs 28 and 32 function similarly to inputs 13 and 17, respectively. Transistor 25 also includes a first control input 27 that is connected to a gate of transistor 26 and a second control input 31 that is connected to a gate of transistor 30. Since the sources of transistors 26 and 30 are connected together, a differential gate-to-gate voltage ($V_{GNGP}$) is applied across the gates of transistors 26 and 30, thus between inputs 27 and 31, to enable and disable transistors 26 and 30, thus, respectively enable and disable transistor 25. Transistors 26 and 30 are formed so that transistor 25 is enabled when the differential gate-to-gate voltage ($V_{GNGP}$) is no greater than a threshold voltage of transistor 25 ($V_{th25}$).

It can be seen from FIG. 2 that:

$$V_{GNGP} = V_{gsND} - V_{gsPE} \qquad \text{[Equation 4]}$$

Where:
$V_{gsPE}$ is the gate-to-source voltage of P-Channel enhancement mode transistor 26, and
$V_{gsND}$ is the gate-to-source voltage of N-Channel depletion mode transistor 30.

As before in the description of transistor 10 of FIG. 1, for transistor 25 to be enabled both transistors 26 and 30 have to be enabled. Transistor 26 is enabled when $V_{gsPE}$ is equal to or greater than the threshold voltage of transistor 26 ($V_{thNE}$), which is a negative number for this P-type enhancement mode transistor, and transistor 30 is enabled when $V_{gsND}$ is greater than the threshold voltage of transistor 30 ($V_{thND}$), which is a negative number for this N-type depletion mode transistor. Substituting the threshold voltage and converting to an inequality determining the conducting state yields:

$$V_{GNGP} \geq V_{thND} - V_{thPE} \qquad \text{[Equation 5]}$$

Thus, transistor 25 is enabled or turned-on when $V_{GNGP}$ is greater than $(V_{thND} - V_{thPE})$.

In the preferred embodiment, $(V_{thND} - V_{thPE})$ is chosen to be less than or equal to zero volts (0 V) so that transistor 25 is enabled when $V_{GNGP}$ is greater than or equal zero in order to provide a known state for transistor 25. Substituting into the above equation yields:

$$0 \geq V_{thND} - V_{thPE} \qquad \text{[Equation 6]}$$

Consequently, in the preferred embodiment transistors 26 and 30 are formed so that the difference in the threshold voltages ($V_{thND} - V_{thPE}$) is close to zero so that transistor 25 can be turned-on with a minimum applied voltage. Thus, transistors 26 and 30 are formed so that the absolute value of the threshold voltage of transistor 30 is equal to or greater than the threshold voltage of transistor 26. This ensures that transistor 25 is enabled whenever $V_{GNGP}$ is greater than or equal to zero. Thus, transistor 25 is enabled or turned-on when no $V_{GNGP}$ voltage is applied and is turned-off or disabled by applying a $V_{GNGP}$ voltage that is less than $(V_{thND} - V_{thPE})$. In order to provide tolerances for process and other manufacturing variations, the threshold voltage of transistor 30 is formed so that it is never more than that of transistor 26, as shown by Equation 6. The threshold voltage of transistors 26 and 30 can be formed or adjusted by a variety of methods and processes that are well known to those skilled in the art.

It can be seen from the prior explanation, that transistor 25 can also be formed to have a threshold voltage that is a value other than zero, and that transistors 26 and 30 can be formed to enable transistor 25 when $V_{GNGP}$ is greater than that threshold voltage, and to disable transistor 25 when $V_{GNGP}$ is less than that threshold voltage. As before in the description of transistor 10, it is important to form transistors 26 and 30 so the respective threshold voltages satisfy equations 5 and 6 in order for transistor 25 to have the desired threshold voltage and operation.

Using only one depletion mode transistor in transistor 25 reduces the number of process steps required to form transistor 25 and reduces the manufacturing cost of transistor 25 and circuits that use transistor 25. The enhancement mode P-channel can be scaled in terms of channel length and width to account for the fact that it has lower mobility than the N-channel depletion mode transistor.

An inverter 34 is shown in FIG. 2 to illustrate that inputs 27 and 31 are driven differentially in order to ensure that transistor 25 is enabled and disabled. Inverter 34 receives an input signal on an input 35. The input signal drives the gate of transistor 26 and inverter 34 drives the gate of transistor 30 with a signal that is out of phase with the input signal to ensure that transistors 26 and 30 are driven differentially to enable transistor 25.

Figure 3:
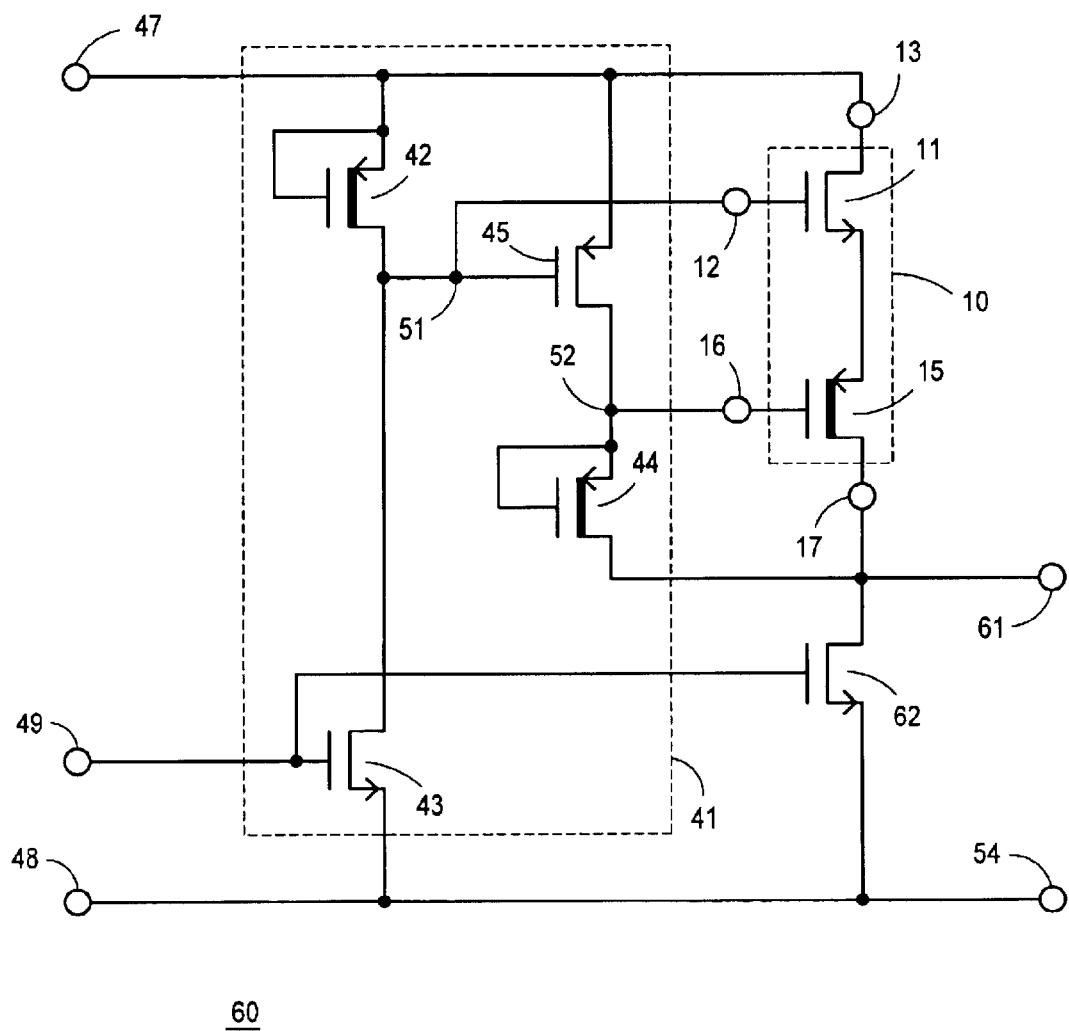
FIG. 3 schematically illustrates an embodiment of a portion of a logic device that uses the differential transistor of FIG. 1 in accordance with the present invention.

FIG. 3 schematically illustrates a portion of an embodiment of a digital inverter 60 that utilizes the preferred embodiment of transistor 10 that is illustrated in FIG. 1. Inverter 60 includes a driver 41, an N-channel output transistor 62, an output 61, a signal input 49, and transistor 10. Inverter 60 receives power between a power input 47 and a power return 48, and has a signal return 54 that typically is connected to return 48. Driver 41 includes a P-channel depletion mode current source transistor 42, an N-channel input transistor 43, a P-channel inverter transistor 45, and a P-channel depletion mode current sink transistor 44.

When input 49 is high, above the threshold voltage of transistor 43, transistor 43 is enabled and node 51 is pulled low, to the voltage of return 48. The low at node 51 enables transistor 45 to pull node 52 high, to the voltage of input 47. The differential voltage applied to inputs 12 and 16 of transistor 10 is less than the threshold voltage of transistor 10, thus, transistor 10 is disabled. The high on input 49 also enables transistor 62 to drive output 61 low.

When input 49 is low, transistors 43 and 62 are disabled. Since transistor 42 is a depletion mode transistor, it is enabled to pull node 51 high. The high at node 51 disables transistor 45 allowing transistor 44 to apply the voltage of output 61 to input 16 of transistor 10. The voltage on output 61 generally is much less than the voltage on input 47 thereby ensuring that the differential voltage is greater than the threshold voltage of transistor 10. Consequently the differential voltage applied to inputs 12 and 16 is greater than the threshold voltage of transistor 10 and transistor 10 is enabled to drive output 61 high.

It should be noted that transistor 25 may be substituted for transistor 10 in inverter 60.

In order to facilitate the operation of inverter 60, transistor 42 has a source connected to input 47 and to a gate of transistor 42. A drain of transistor 42 is connected to node 51 and to a drain of transistor 43. Transistor 43 has a source connected to return 48 and a gate connected to input 49 and to a gate of transistor 62. Transistor 62 has a source connected to return 48 and a drain connected to output 61, to the drain of transistor 15, and to the drain of transistor 44. A source of transistor 44 is connected to a gate of transistor 44, to node 52, to a gate of transistor 15, and to a drain of transistor 45. A gate of transistor 45 is connected to node 51 and to a gate of transistor 11, and a source of transistor 45 is connected to input 47. A drain of transistor 11 is connected to input 47.

Those skilled in the art will realize that transistor 10 and driver 41 can be used to form other logic elements such as gates, flip-flops, etc.

Figure 4:
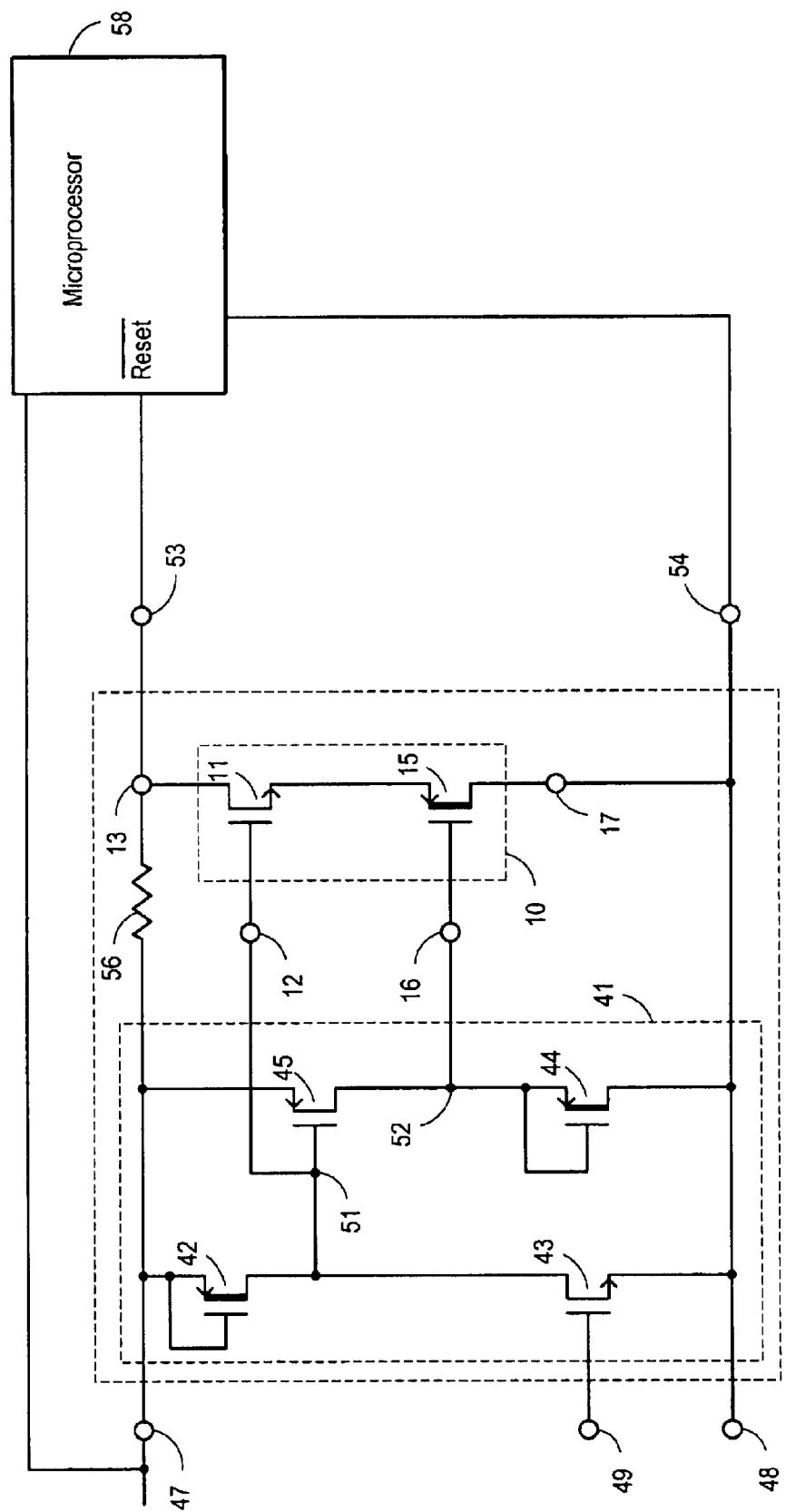
FIG. 4 schematically illustrates an embodiment of a portion of a power controller that uses the differential transistor of FIG. 1 in accordance with the present invention.

FIG. 4 schematically illustrates a portion of an embodiment of a power-on controller 40 that utilizes the preferred embodiment of transistor 10, illustrated in FIG. 1, and driver 41 that is illustrated in FIG. 3. It should be noted that the drain of transistor 44 of driver 41 is connected to return 48 instead of the connection shown in FIG. 3. Controller 40 also includes a load resistor 56 that is connected between input 47 and an output 53 of controller 40. Input 13 of transistor 10 is connected to output 53. Controller 40 receives a power control signal on signal input 49 and responsively controls an output voltage on an output 53 of controller 40. Controller 40 is formed to ensure that, for all values of the voltage applied to input 47, the output voltage on output 53 is coupled to return 54 when the control signal on input 49 is low.

When the voltage applied to input 47 is substantially zero and the control signal applied to input 49 is low, transistor 43 is disabled. Since transistor 42 is a depletion mode transistor, transistor 42 is enabled and couples node 51 to input 47. Therefore, transistor 45 is disabled. Because transistor 44 is a depletion mode transistor, transistor 44 is enabled to couple node 52 to return 54, thus, the differential voltage applied between inputs 12 and 16 is substantially zero volts. Since the threshold voltage of transistor 10 is substantially zero volts, transistors 11 and 15 are enabled and output 53 is coupled to return 54. As the value of the voltage on input 47 increases, transistor 42 couples the voltage increase to node 51 and to input 12 of transistor 10. This increases the differential voltage between inputs 12 and 16 of transistor 10 thereby ensuring that transistor 10 is enabled and that output 53 remains at the voltage of return 54 regardless of the value of the voltage on input 47. When input 49 is driven high, transistor 43 is enabled and couples node 51 to return 48. The low voltage at node 51 enables transistor 45 to pull output 53 to the voltage of input 47, thus, $V_{GNGP}$ is less than the threshold voltage of transistor 10 thereby disabling transistor 11 and transistor 10. With transistor 10 disabled, resistor 56 pulls output 53 to the value of the voltage on input 47.

One application for controller 40 is part of a power supervisor system of a microprocessor 58. Output 53 of controller 40 is connected to a signal input, such as a reset bar (i.e. negative reset) input, of microprocessor 58. Such power supervisor systems are well known to those skilled in the art.

Figure 5:
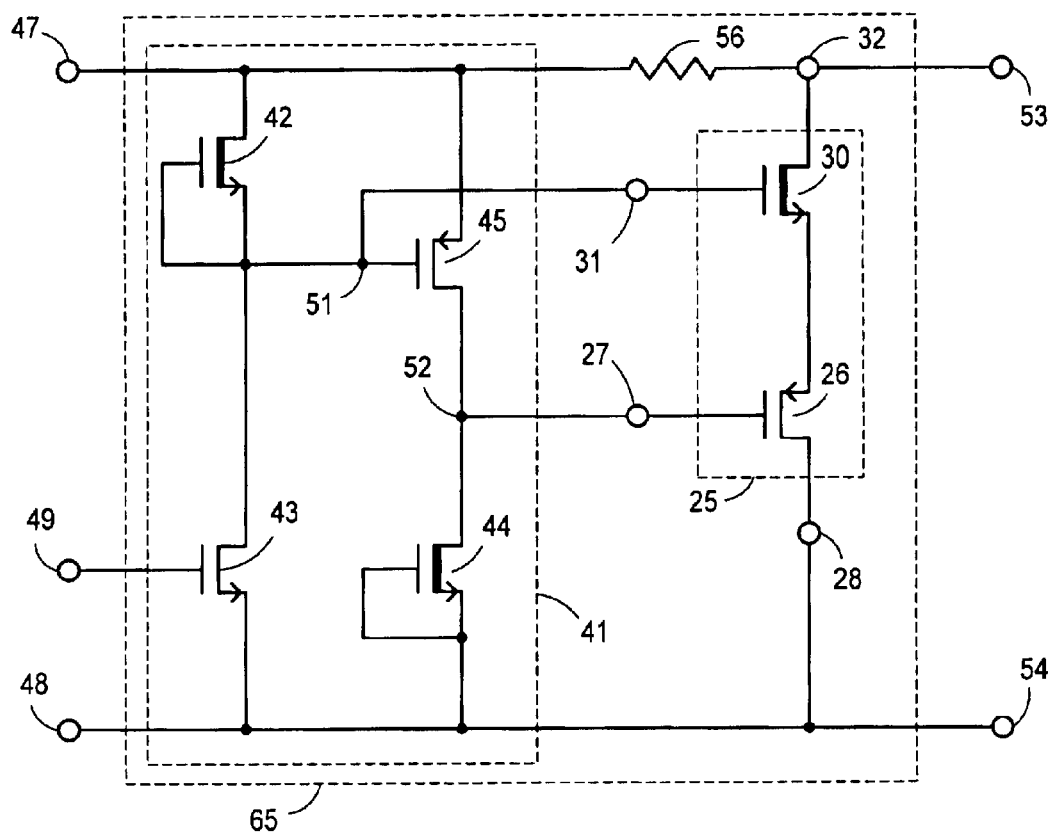
FIG. 5 schematically illustrates a portion of another embodiment of a power controller that uses the differential transistor of FIG. 2 in accordance with the present invention.

FIG. 5 schematically illustrates a portion of an embodiment of a power-on controller 65 that is an alternate embodiment of controller 40 illustrated in FIG. 4. Controller 65 utilizes transistor 25, that is illustrated in FIG. 2 instead of transistor 10. Controller 65 functions similarly to controller 40.

Figure 6:
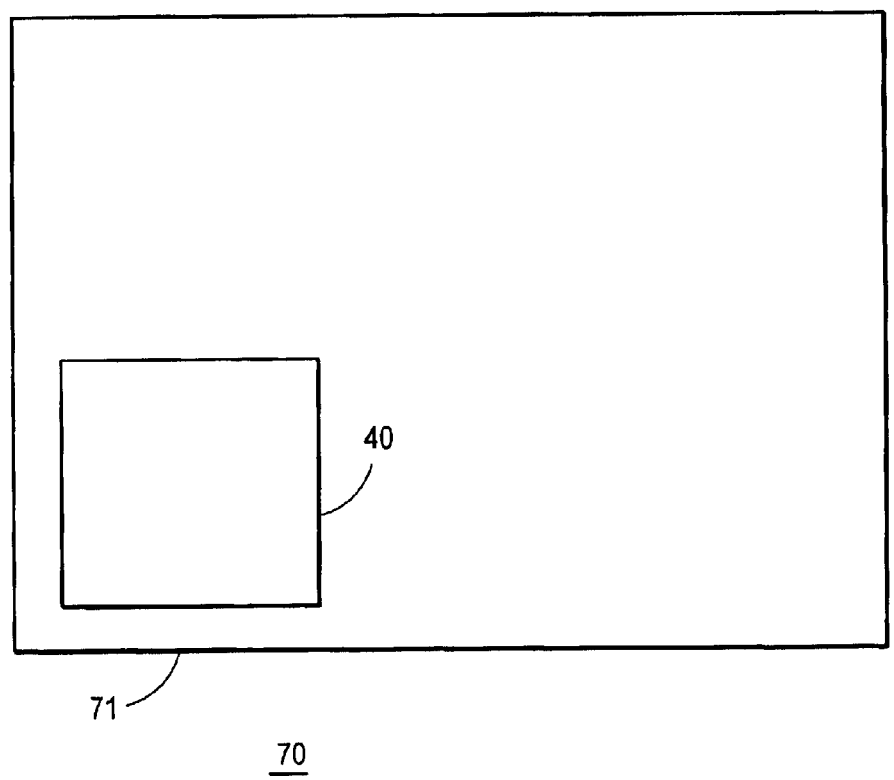
FIG. 6 illustrates an enlarged plan view of a semiconductor device that includes the power controller of FIG. 3 in accordance with the present invention.

FIG. 6 schematically illustrates an enlarged plan view of a portion of an embodiment of a semiconductor device 70 that is formed on a semiconductor die 71. Controller 40 is formed on die 71 as at least a portion of device 70. Die 71 may also include other circuits that are not shown in FIG. 6.

In view of all of the above, it is evident that a novel device and method is disclosed. Included, among other features, is forming a transistor having an enhancement mode transistor and a depletion mode transistor with sources connected together and having a combined threshold voltage that is less than zero. The low combined threshold voltage facilitates enabling the transistor with substantially zero volts. Using only one depletion mode transistor to form transistors 10 and 25 reduces manufacturing steps and lowers the manufacturing costs. Using only one type of depletion mode transistor (all P-type or all N-type) in a circuit, such as inverter 60 and controllers 40 and 65, also reduces the manufacturing steps and lowers the manufacturing costs.

While the invention is described with specific preferred embodiments, it is evident that many alternatives and variations will be apparent to those skilled in the semiconductor arts.

What is claimed is:

1. A method of forming a differential transistor comprising:
   forming an enhancement mode transistor of a first conductivity type having a source coupled to a source of a depletion mode transistor of a second conductivity type;
   forming a threshold voltage of the enhancement mode transistor so that an absolute value of the threshold voltage of the enhancement mode transistor is no greater than an absolute value of a threshold voltage of the depletion mode transistor;
   forming a second depletion mode transistor having a gate and a source coupled to receive a voltage from a voltage source and having a drain coupled to a gate of one of the enhancement mode transistor and the depletion mode transistor;
   forming a third depletion mode transistor having a drain coupled to a drain of the depletion mode transistor and having a gate and a source coupled to a gate of the other one of the enhancement mode transistor and the depletion mode transistor.

2. A method of forming a differential transistor comprising:
   forming an enhancement mode transistor of a first conductivity type having a source coupled to a source of a depletion mode transistor of a second conductivity type;

forming a threshold voltage of the enhancement mode transistor so that an absolute value of the threshold voltage of the enhancement mode transistor is no greater than an absolute value of a threshold voltage of the depletion mode transistor;

coupling a gate of the enhancement mode transistor to a gate of another enhancement mode transistor, coupling a drain of the depletion mode transistor to a voltage return, coupling a gate of the depletion mode transistor to a gate and a source of another depletion mode transistor and to a drain of the another enhancement mode transistor, coupling a source of the another enhancement mode transistor to receive a voltage from a voltage source; and coupling a drain of the enhancement mode transistor to a first terminal of a resistor and to a signal input of a microprocessor, and coupling a second terminal of the resistor to receive the voltage from the voltage source.

3. The method of claim 2 further including coupling a drain of the another depletion mode transistor to the voltage return.

4. A method of forming a differential transistor comprising:

forming an enhancement mode transistor of a first conductivity type having a source coupled to a source of a depletion mode transistor of a second conductivity type;

forming a threshold voltage of the enhancement mode transistor so that an absolute value of the threshold voltage of the enhancement mode transistor is no greater than an absolute value of a threshold voltage of the depletion mode transistor;

coupling a drain of the enhancement mode transistor to receive a voltage from a voltage source;

coupling a gate of the enhancement mode transistor to a gate of another enhancement mode transistor, coupling a drain of the depletion mode transistor to a signal mode, coupling a gate of the depletion mode transistor to a gate and a source of another depletion mode transistor and to a drain of the another enhancement mode transistor, coupling a source of the another enhancement mode transistor to receive the voltage from the voltage source; and coupling a drain of the another depletion mode transistor to a drain of a lower output transistor and coupling a source of the lower output transistor to a voltage return.

5. A method of forming a differential transistor comprising:

forming an enhancement mode transistor of a first conductivity type having a source coupled to a source of a depletion mode transistor of a second conductivity type; and forming a threshold voltage of the enhancement mode transistor so that an absolute value of the threshold voltage of the enhancement mode transistor is no greater than an absolute value of a threshold voltage of the depletion mode transistor; and coupling the drain of the depletion mode transistor to receive a first signal, coupling a gate of the depletion mode transistor to a gate of another enhancement mode transistor, coupling the drain of the enhancement mode transistor to a voltage return, coupling a gate of the enhancement mode transistor to a drain of another depletion mode transistor and to a drain of the another enhancement mode transistor, coupling a source of the another depletion mode transistor to a gate of the another depletion mode transistor, and coupling a source of the another enhancement mode transistor to receive a voltage from a voltage source.

6. The method of claim 5 wherein coupling the drain of the depletion mode transistor to receive the first signal includes coupling the drain of the depletion mode transistor to a first terminal of a resistor and to a signal input of a microprocessor and coupling a second terminal of the resistor to receive the voltage from the voltage source.

7. The method of claim 5 further including coupling the source of the another depletion mode transistor to the voltage return.

8. A differential transistor comprising:

a depletion mode MOS transistor of a first conductivity type having a first source, a first drain, a first gate, and a first threshold voltage;

an enhancement mode MOS transistor of a second conductivity type having a second source connected to the first source, having a second drain, having a second gate, and having a second threshold voltage having an absolute value that is less than an absolute value of the first threshold voltage, wherein the first drain is coupled to a first terminal of a resistor and to a signal input of a microprocessor and wherein a second terminal of the resistor is coupled to a voltage source.

9. The differential transistor of claim 8, wherein including the second drain is coupled to a voltage return.

10. A differential transistor comprising:

a depletion mode MOS transistor of a first conductivity type having a first source, a first drain, a first gate, and a first threshold voltage;

an enhancement mode MOS transistor of a second conductivity type having a second source connected to the first source, having a second drain, having a second gate, and having a second threshold voltage having an absolute value that is less than an absolute value of the first threshold voltage, the second drain coupled to a first terminal of a resistor and to a signal input of a microprocessor, a second terminal of the resistor coupled to a voltage source, and the first drain coupled to a voltage return.

* * * * *